United States Patent [19]

Jordan et al.

[11] Patent Number: 4,709,302

[45] Date of Patent: Nov. 24, 1987

[54] ALIGNMENT APPARATUS FOR ELECTRONIC DEVICE PACKAGE

[75] Inventors: William D. Jordan, Dallas; Donald L. Clemens, The Colony, both of Tex.

[73] Assignee: Thermalloy Incorporated, Dallas, Tex.

[21] Appl. No.: 942,097

[22] Filed: Dec. 16, 1986

[51] Int. Cl.⁴ .............................................. H05K 7/20
[52] U.S. Cl. ............................... 361/388; 174/16 HS; 165/80.2; 357/81; 361/386
[58] Field of Search ....................... 361/386, 388, 389; 29/834, 837–839; 339/112 R; 165/80.2, 185; 357/81; 174/16 HS

[56] References Cited

U.S. PATENT DOCUMENTS 4,054,901 10/1977 Edwards et al. ............ 174/16 HS X
4,235,285 11/1980 Johnson et al. ............ 174/16 HS X
4,441,140 4/1984 Richard .............................. 361/386

FOREIGN PATENT DOCUMENTS 1534883 12/1978 United Kingdom ............ 339/112 R

Primary Examiner—Joseph H. McGlynn
Assistant Examiner—Steven C. Bishop
Attorney, Agent, or Firm—Kanz, Scherback & Timmons

[57] ABSTRACT

Disclosed is apparatus for mounting electronic device packages and heat sinks on printed circuit boards with the pin connectors of the electronic device package held in alignment with preformed locations on the printed circuit boards. The alignment apparatus includes means for securing the electronic device package in intimate thermal contact with the heat sink for rapid dissipation of heat therefrom.

20 Claims, 14 Drawing Figures

ALIGNMENT APPARATUS FOR ELECTRONIC DEVICE PACKAGE

FIELD OF THE INVENTION

This invention relates generally to alignment apparatus for use in mounting electronic device packages on printed circuit boards. More particularly, but not by way of limitation, this invention relates to alignment apparatus useful in mounting heat sinks and electronic device packages and the like on printed circuit boards.

BACKGROUND OF THE INVENTION

In the assembly of electronic apparatus it is necessary to position electronic device packages which have multiple pin connectors and the like on multiple preformed locations on a printed circuit board. The multiple preformed locations for receiving the pin connectors on a printed circuit board may constitute holes in the printed circuit board or areas on the surface of the printed circuit board to which the pin connectors may be soldered such as shown in U.S. Pat. No. 4,625,260 entitled Fasteners for Surface Mounting of Printed Circuit Board Components. Frequently, it is also necessary to locate a heat sink on the electronic device package so that intimate thermal contact is maintained therebetween.

It is also sometimes necessary to attach the heat sink on the printed circuit board and this is commonly accomplished by structures projecting from the heat sink and mounted on preformed locations on the printed circuit board so that the heat sink can be securely attached to the printed circuit board such as by soldering. More often than not, these structures are separate components from the heat sink and include some releasable arrangement so that the heat sink can be removed from the printed circuit board if desired. Thus, in order to mount an electronic device package and a heat sink, it is necessary that a multiplicity of pin connectors and structures be simultaneously aligned with the preformed locations on the printed circuit board. In the past sub-assemblies of parts, such as heat sinks and transistors were manually assembled and then manually placed with the pin connectors and structures on the appropriate locations in the printed circuit board. Manifestly, such manual assembly techniques are slow, labor intensive and thus expensive.

Many electronic circuits are currently being assembled by robots or the like and, after the electronic device packages are placed on the printed circuit board, mass soldering techniques are utilized so that all the electronic components, including the electronic device packages and the heat sinks, are soldered to the printed circuit board simultaneously and virtually instantaneously. Up to now it has remained necessary, because of the alignment problems, to manually assemble the electronic device packages to their heat sinks and then manually assemble the sub-assembled parts on the printed circuit boards.

SUMMARY OF THE INVENTION

This invention provides alignment apparatus which permits electronic device packages and heat sink assemblies to be mounted on a printed circuit board with all the pin connectors of the electronic device package aligned for engagement with preformed printed circuit board locations so that the assembly can be made by the use of robotic techniques. It thus provides alignment apparatus for use in conjunction with printed circuit boards, heat sinks and electronic device packages having pin connectors and the like. The alignment apparatus includes an electrically insulating body having a plurality of holes extending through the body for receiving, aligning and retaining the pin connectors in a precise predetermined relationship. Means are provided to attach the heat sink to the body of the alignment apparatus with the electronic device package detachably secured in intimate thermal contact with the heat sink and to mount the alignment apparatus, electronic device package and heat sink, on the printed circuit board with the pin connectors of the electronic device package soldered to preformed locations on the printed circuit board.

BRIEF DESCRIPTION OF THE DRAWING

So that the manner in which the above recited features and advantages of the invention, as well as others which will become apparent to those skilled in the art, are obtained and can be understood in detail, a more particular description of the invention briefly summarized above may be had by reference to the embodiments thereof which are illustrated in the accompanying drawings, which drawings form a part of the specification and in which like numerals depict like parts in the several views. It is noted, however, that the appended drawings illustrate only a preferred embodiment of the invention and are therefore not to be considered limiting of its scope, for the invention may admit to other equally effective embodiments.

DETAILED DESCRIPTION OF THE INVENTION

Figures 2A, 2B:
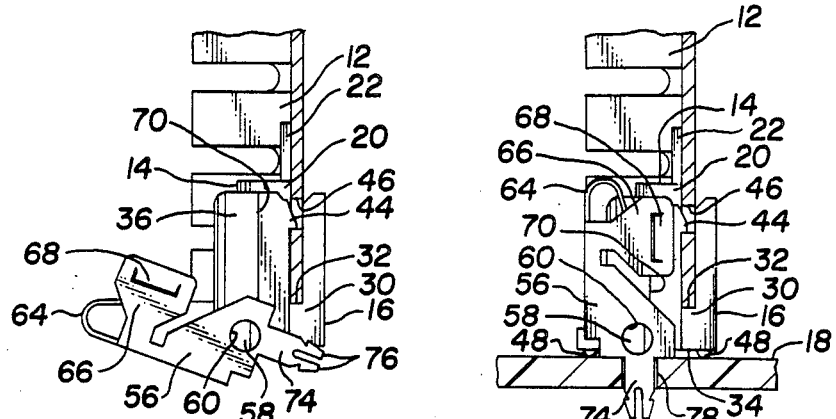
FIG. 2A is a partial side view of the alignment apparatus, heat sink and electronic device package of FIG. 1 in a first position prior to mounting on the printed circuit board.
FIG. 2B is a partial side view of the alignment apparatus, heat sink and electronic device package of FIG. 2A in a second position and mounted on a printed circuit board.
Figure 1:
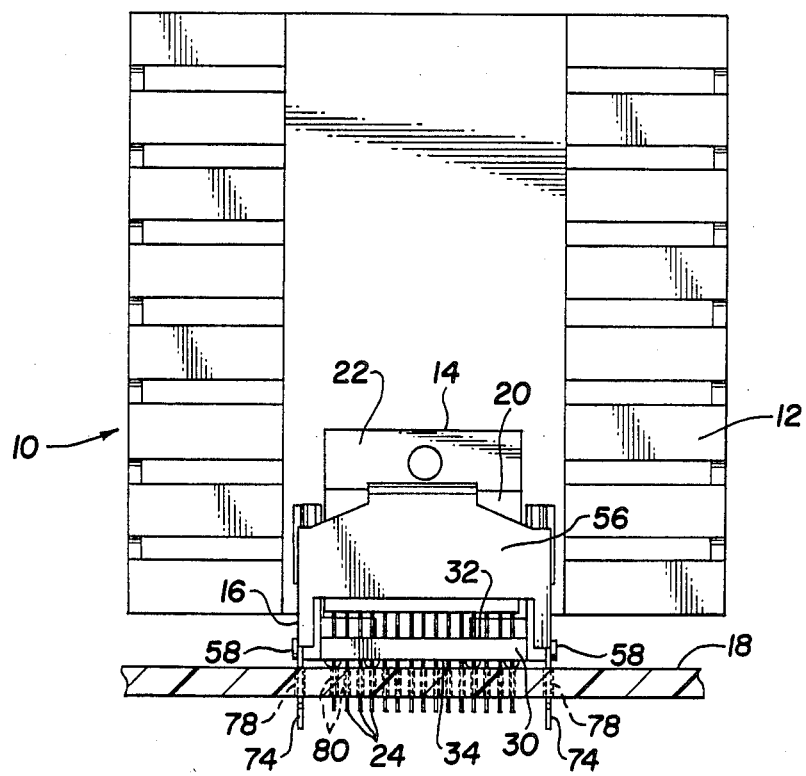
FIG. 1 is a front elevational view of a heat sink, electronic device package and alignment apparatus constructed in accordance with the invention and located on a printed circuit board.
Figure 3:
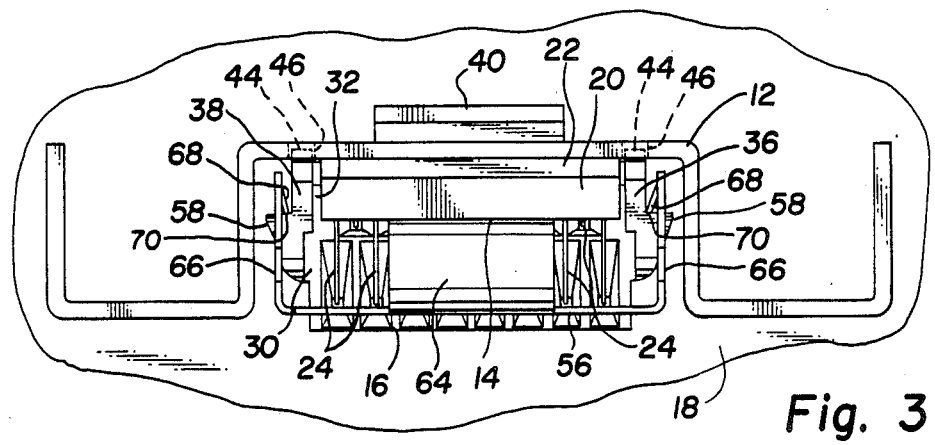
FIG. 3 is a top view of the heat sink, electronic device package and alignment apparatus of FIG. 1.

Referring to the drawings and FIGS. 1-3 in particular, shown therein and generally designated by the reference numeral 10 is a sub-assembly consisting of a heat sink 12, an electronic device package 14, an alignment apparatus 16 and a printed circuit board 18 or the like. Heat sink 12 is generally constructed from material of high thermal conductivity such as aluminum or alloys thereof. The heat sink is usually anodized and thus is virtually impossible to solder directly to the printed circuit board. The electronic device package includes housing 20 mounted on flange 22 and one or more downwardly depending pin connectors 24. In the illustrated embodiment the electronic device package takes the form of a TO-220 type electronic device package and, more specifically, a Multi-Watt "R" type component manufactured by the SGS Semiconductor Corporation having two parallel rows of pin connectors extending from one longitudinal side edge of the housing (i.e. one row with seven pin connectors and a second adjacent row with eight pin connectors).

Figure 4:
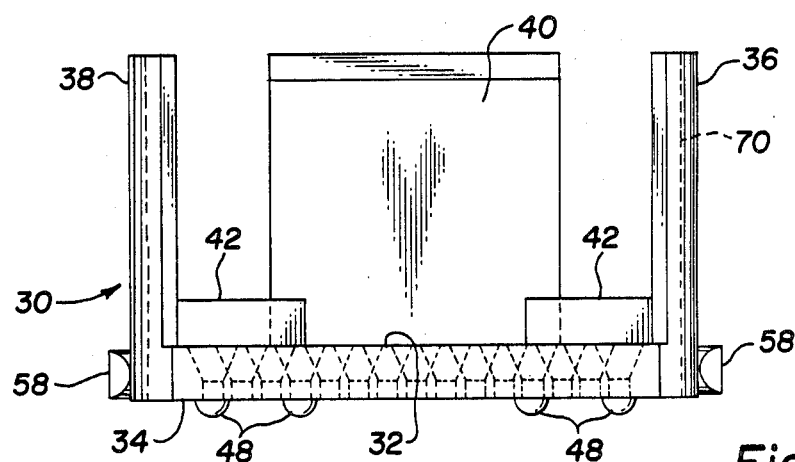
FIG. 4 is a front elevational view of the body of the alignment apparatus of FIG. 1.
Figure 5:
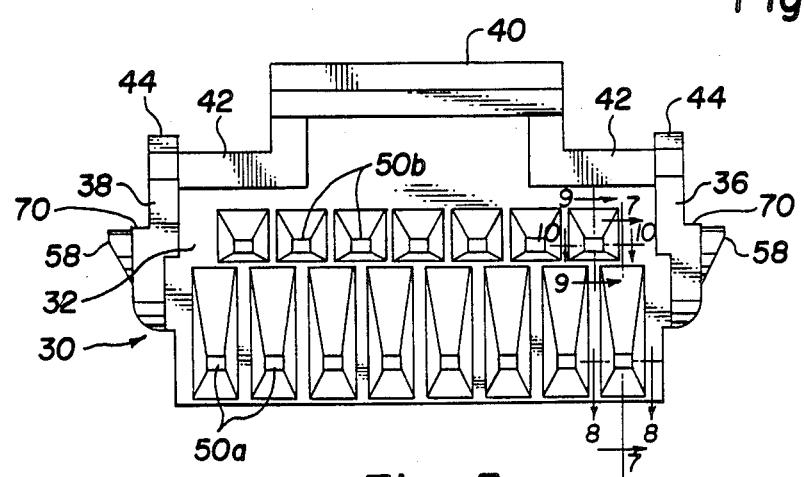
FIG. 5 is a top view of the body of the alignment apparatus of FIG. 4.
Figure 6:
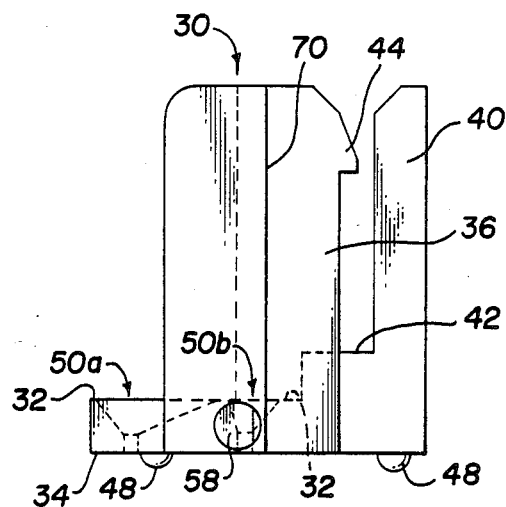
FIG. 6 is a side view of the body of the alignment apparatus of FIG. 4.
Figure 7:
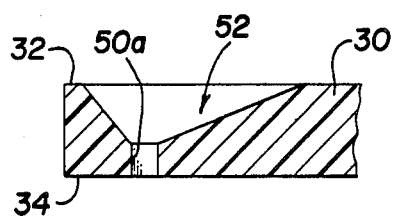
FIG. 7 is a longitudinal cross-sectional view of a first hole for receiving a pin connector taken along plane 7—7 of FIG. 5.
Figure 8:
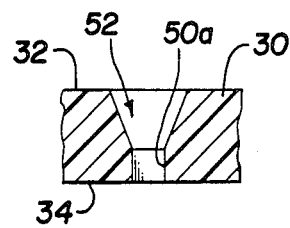
FIG. 8 is a transverse cross-sectional view of the first hole for receiving a pin connector taken along plane 8—8 of FIG. 5.
Figure 9:
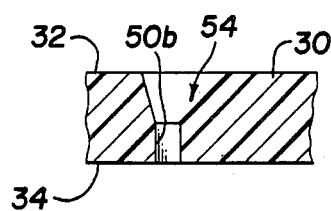
FIG. 9 is a longitudinal cross-sectional view of a second hole for receiving a pin connector taken along plane 9—9 of FIG. 5.
Figure 10:
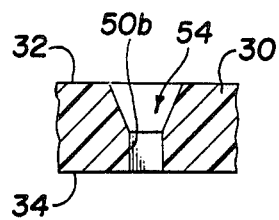
FIG. 10 is a transverse cross-sectional view of the second hole for receiving a pin connector taken along plane 10—10 of FIG. 5.

Alignment apparatus 16 includes a body 30 (shown in greater detail in FIGS. 4-6) defining top surface 32 and bottom surface 34. The body is preferably a monolithic molded piece formed from electrically insulating material such as nylon. Connection means are formed on the body to attach the heat sink to the body and includes three upwardly projecting spaced tabs 36, 38 and 40, respectively. The tabs are located in an alternating arrangement to receive the heat sink between the tabs 36 and 38 on one side and tab 40 on the other side. On the top surface of the alignment device are formed one or more spacing elements 42 (shown in FIGS. 4-6) for contacting the lower edge of the heat sink when inserted into the tab and to accurately position the heat sink with respect to the top surface of the alignment device body. The tabs 36 and 38 each include a tooth 44. Each tooth 44, is aligned with and engages a hole 46 formed in the heat sink when the heat sink is attached to the alignment apparatus body. The heat sink is detachable from the body 30 by manually deflecting the tabs 36 and 38 outwardly to release the teeth 44 from their respective holes 46 in the heat sink. On the bottom surface, the alignment device is provided with one or more protuberances 48 to maintain body 30 a predetermined distance above the surface of the printed circuit board. The protuberances provide access to the underside of the body of the alignment device, such as after flow soldering procedures, for cleaning purposes.

The body also includes a suitable number of pin connector holes extending from the top surface to the bottom surface. The shape, arrangement and size of the pin connector holes is determined by the electronic device package with which the alignment device is to be used and, in the illustrated embodiment, are formed in two parallel rows having seven (50a) and eight (50b) holes, respectively, in each row. The holes are formed with inwardly and downwardly tapering upper ends 52 and 54, respectively, as shown in FIGS. 7-10 for guiding the various pin connectors 24 into the holes as the electronic device package is positioned in the alignment apparatus body. The preformed holes in the printed circuit board are formed in the board with great accuracy so that the electronic device package will be properly located to form the desired circuits when mounted on the printed circuit board. To assure that the pin connectors are positioned to match the preformed locations in the printed circuit board, the alignment device is preferably die cast and the necessary holes located therein so that the relationship of all the holes will be within ±0.0003 inch.

For purposes of this invention, the term "hole" as applied to the holes 50a and 50b in the body also includes one or more similarly sized and shaped slots or grooves extending from the top to the bottom surface of the body along any of the edges of the body. The slots or grooves would function identically as herein described with respect to holes 50a and 50b.

Figure 12:
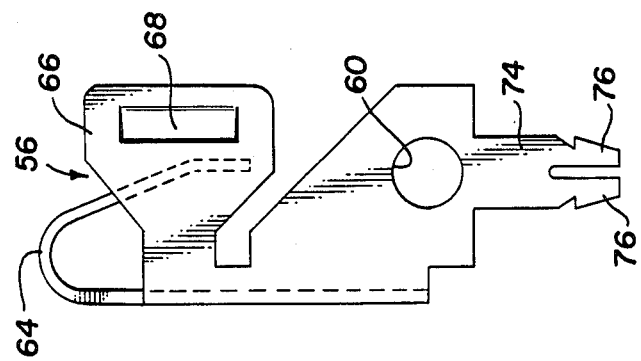
FIG. 12 is a side view of the door of FIG. 11.
Figure 11:
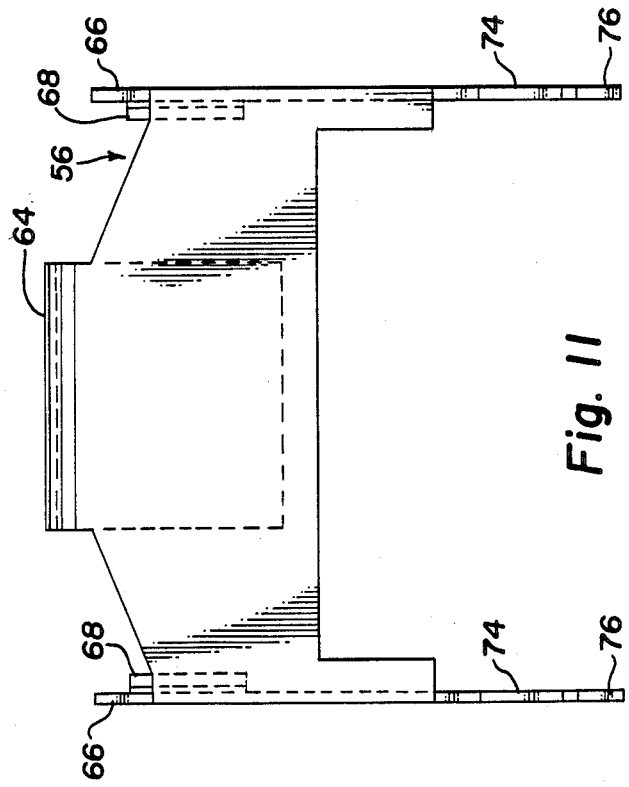
FIG. 11 is a front elevational view of the door of the alignment apparatus of FIG. 1.
Figure 13:
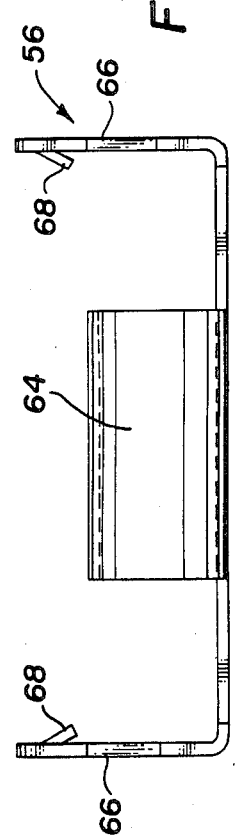
FIG. 13 is a top view of the door of FIG. 11.

Means are provided to secure the electronic device package in intimate thermal contact to the heat sink. The securing means includes attachment door 56 shown in greater detail in FIGS. 11-13. The attachment door preferably includes a unitary body formed from resilient metallic material. The door is pivotally attached to the body 30 by laterally projecting pegs 58 formed on the body engaging holes 60 in the door so that the door is shiftable between a first position shown in FIG. 2A for loading and unloading an electronic device package from the alignment apparatus and a second position shown in FIG. 2B for securing the electronic device package to the heat sink and for mounting the sub-assembly on a printed circuit board.

The attachment door also includes upwardly extending clip 64. The clip 64 is positioned on the attachment door for contact with the electronic device package intermediate the tabs 36 and 38 when the door is in its second position. The door acts to resiliently urge the electronic device package into good thermal contact with the heat sink and to secure the electronic device package in the desired position when mounted on the printed circuit board. Preferably, the clip 64 is positioned so as to apply force to the midpoint of the electronic device package.

Means are provided to latch the door in engagement with the body 30 of the alignment apparatus and secure the clip 64 in contact with the electronic device package. The latching means includes a pair of laterally spaced arms 66, each defining inwardly extending tangs 68. A pair of opposing shoulders 70 extends from the body of the alignment apparatus. As the door is shifted from its first position to its second position, the arms 66 encounter flanges 70 and are deflected outwardly until the tangs 68 pass the shoulders. At that point the tabs 66 spring inwardly and secure the door in its second position through contact between the tangs 68 and the shoulders 70.

Means are provided to attach the sub-assembly including the alignment apparatus, electronic device package and heat sink to a printed circuit board. A pair of integral mounting tabs 74 extend laterally from either side of the door. The lower ends of the mounting tabs are adapted for mounting on the printed circuit board by a solderable connection to preformed locations on the printed circuit board. Preferably, the mounting tabs are at least partially coated with a solder-promoting coating. Each of the mounting tabs includes two outwardly biased fingers 76 which frictionally engage the walls of aligned holes 78 in the printed circuit board. The fingers secure the sub-assembly to the printed circuit board with the pin connectors 24 likewise inserted into a plurality of aligned preformed holes 80 in the printed circuit board until the mounting tabs and the pin connectors are permanently soldered in place. Alternatively, the mounting tabs and the pin connectors could be adapted for attachment to the surface of the printed circuit board by soldering. In this alternate embodiment the mounting tabs and pin connectors include a surface disposed parallel with the surface of the printed circuit board and adapted for soldering to preformed mounting pads on the printed circuit board.

Thus, the alignment apparatus of this invention combines the functions of mounting the heat sink and electronic device package on the printed circuit board with all the pin connectors of the electronic device package aligned and located on preformed locations of the printed circuit board and of securing the electronic device package in intimate thermal contact with the heat sink. This enables the assembled heat sink and electronic device package to be automatically mounted on the printed circuit board with the attendant advantages discussed above.

Although the invention has been described above with regard to particular and preferred embodiments, these are advanced for illustrative purposes only and are not intended to limit the scope of this invention. For instance, the attachment door may be formed with a single mounting tab. It is frequently advantageous to connect two or more electronic device packages to the same heat sink to conserve surface on the printed circuit board and to reduce material and manufacturing costs. This may be accomplished by extending the body 30 on the other side of the heat sink and providing a second set of aligned holes (50a, 50b) for receipt of the pin connectors of a second electronic device package. A second pivotally connected door could also be provided to secure the second electronic device package in intimate thermal contact to the heat sink. The tab 40 could be eliminated and replaced by additional tabs opposing and substantially identical to tabs 36 and 38 for engaging holes 46 in the heat sink. It is also within the spirit and scope of this invention to provide alignment apparatus for mounting an electronic device package having pin connectors on a printed circuit board while omitting a heat sink. In such an embodiment the alignment apparatus would omit the connection means but include structure for contacting the electronic device package opposite the clip of the attachment door when latched in its second position. For instance, tab 40 could be constructed and positioned on the body 30 for such purposes.

Finally, it is within the spirit and scope of this invention to provide an attachment door 56 having a heat sink (not shown) projecting therefrom so that latching the attachment door 56 in its second position enables heat generated by the electronic device package to be conveyed through the clip 64 to the heat sink for rapid dissipation of the heat into the environment. In such an embodiment the heat sink 12 would be eliminated and the tab 40 adapted for contact with the electronic device package opposite clip 64. Preferably, the heat sink of the attachment door is integrally formed with the clip and mounting tabs. These variations remain within the scope of the invention as defined by the appended claims.

What is claimed is:

1. Alignment apparatus for use in connection with printed circuit boards, heat sinks and electronic device packages having pin connectors and the like, said apparatus comprising:
   (a) an electrically insulating body having connection means for releasably connecting said body to a heat sink and having a plurality of holes extending through said body for receiving, aligning and retaining the pin connectors of an electronic device package in a predetermined relationship;
   (b) solderable securing and attachment means attached to said body and shiftable with respect to said body between a first position for loading and unloading the electronic device package from said body and a second position with respect to said body including;
      (i) means for securing the electronic device package in intimate thermal contact with the heat sink when said solderable securing and attachment means is in said second position; and
      (ii) means for mounting the alignment apparatus, the heat sink and electronic device package on a printed circuit board with the pin connectors of the electronic device package presented for soldering to preformed locations on the printed circuit board; and
   (c) means for releasably latching said solderable securing and attachment means to said body in said second position.

2. Alignment apparatus as defined in claim 1 wherein said solderable securing and attachment means includes an attachment door pivotally mounted on said body and rotatable with respect to said body between said first and second second positions and having at least one solderable mounting tab for mounting on the printed circuit board.

3. Alignment apparatus as defined in claim 2 wherein said attachment door comprises a unitary body having a resilient clip for contact with the electronic device package when said door is rotated to said second position to secure the electronic device package to the heat sink.

4. Alignment apparatus as defined in claim 1 wherein:
   (a) said body includes a top and a bottom surface through which said holes extend; and
   (b) said connection means includes spaced tab means projecting upwardly from said top surface of said body for releasably connecting said body to the heat sink.

5. Alignment apparatus as defined in claim 4 wherein said tab means includes three tab members projecting from said top surface of said body and located in alternate positions defining a space therebetween for receiving the heat sink.

6. Alignment apparatus as defined in claim 5 wherein at least one of said tab members includes a tooth for insertion in an aligned hole in the heat sink to connect the heat sink to said body.

7. Alignment apparatus as defined in claim 4 wherein said solderable securing and attachment means includes an attachment door pivotally mounted on said body and rotatable with respect to said body between said first and said second positions and having at least one solderable mounting tab for mounting on the printed circuit board.

8. Alignment apparatus as defined in claim 7 wherein said attachment door comprises a unitary body having a resilient clip for contact with the electronic device package when said door is rotated to said second position to secure the electronic device package to the heat sink.

9. Alignment apparatus for use in connection with printed circuit boards, heat sinks and electronic device packages having pin connectors and the like, said apparatus comprising:

(a) an electrically insulating body having connection means for releasably connecting said body to a heat sink and having a plurality of holes extending through said body for receiving, aligning and retaining the pin connectors in predetermined relationship; and (b) a securing and attachment member for attaching said alignment apparatus to the printed circuit board pivotally attached to said body and rotatable with respect to said body between said first and said second positions and having:

(i) a pair of laterally spaced, downwardly extending mounting tabs adapted for soldering to preformed locations on a printed circuit board for mounting the alignment apparatus thereon;

(ii) a resilient clip for securing the electronic device package in intimate thermal contact with a heat sink when said securing and attachment member is in said second position; and (iii) a latching member for releasable engagement with said body so as to maintain said securing and attachment member in said second position.

10. Alignment apparatus as defined in claim 9 wherein said mounting tabs of said securing and attachment member include a surface having solder-promoting coating thereon for preventing parallel with the printed circuit board when the apparatus is adjacent the printed circuit boarded for mounting said attachment member and said body thereon.

11. Alignment apparatus as defined in claim 9 wherein said mounting tabs of said attachment member include a solder-promoting coating for insertion into preformed holes in the printed circuit board and soldering therewithin for mounting said attachment member and said body thereon.

12. The combination comprising:
(a) a printed circuit board;
(b) a heat sink;
(c) an electronic device package having one or more pin connectors extending therefrom; and
(d) alignment apparatus for mounting said heat sink and said electronic device package on said printed circuit board including:

(i) an electrically insulating body having connection means for releasably connecting said body to said heat sink and a plurality of holes extending through said body for receiving, aligning and retaining said pin connectors of said electronic device package in predetermined relationship;

(ii) solderable securing means attached to said body and shiftable with respect to said body between a first position for loading and unloading the electronic device package from the alignment apparatus and a second position with respect to said body;

(iii) means for securing said electronic device package in intimate thermal contact with the heat sink when said solderable securing means is in said second position;

(iv) means for mounting the alignment apparatus, heat sink and electronic device package on the printed circuit board with the pin connectors of the electronic device package presented for soldering to preformed locations on the printed circuit board; and (v) means for releasably latching said solderable securing means in said second position.

13. Alignment apparatus as defined in claim 12 wherein said solderable securing means includes an attachment door pivotally mounted on said body and rotatable with respect to said body between said first and said second positions.

14. Alignment apparatus as defined in claim 13 wherein said securing means comprises a unitary body having a resilient clip for contact with said electronic device package when said door is rotated to said second position so as to secure said electronic device package in intimate thermal contact with said heat sink.

15. Alignment apparatus as defined in claim 12 wherein:
(a) said body includes a top and a bottom surface through which said holes extend; and
(b) said connection means includes spaced tab means projecting upwardly from said top surface for releasably connecting said body to the heat sink.

16. Alignment apparatus for use in connection with printed circuit boards and electronic device packages having pin connectors and the like, said apparatus comprising:

(a) an electrically insulating body having a plurality of holes extending through said body for receiving, aligning and retaining the pin connectors of an electronic device package in a predetermined relationship;

(b) solderable securing and attachment means attached to said body and shiftable with respect to said body between a first position for loading and unloading the electronic device package form said body in a second position with respect to said body including:

(i) means for securing the electronic device package to said body with the pin connectors received and retained within said holes in said body when said solderable securing and attachment means is in said second position;

(ii) means for mounting the alignment apparatus, heat sink and electronic device package on a printed circuit board with the pin connectors of the electronic device package presented for soldering to preformed locations on the printed circuit board; and (c) means for releasably latching said solderable securing and attachment means to said body in said second position.

17. Apparatus as defined in claim 16 wherein said solderable securing and attachment means includes an attachment door pivotally mounted on said body and rotatable with respect to said body between said first and said second positions and having at least one solderable mounting tab for mounting on the printed circuit board.

18. Alignment apparatus as defined in claim 17 wherein said attachment door comprises a unitary body having a resilient clip for contact with the electronic device package when said door is rotated to said second position to secure the electronic device package to said body.

19. Alignment apparatus as defined in claim 16 wherein:
(a) said body includes top and bottom surfaces through which said holes extend; and
(b) said securing means includes tab means projecting upwardly from said top surface of said body for contacting the electronic device package when mounted on the body oppositely of the attachment door when said attachment door is in said second position to secure the electronic device package to said body.

20. Alignment apparatus as defined in claim 18 including a heat sink member projecting from said attachment door for rapid dissipation of heat from the electronic device package to the environment.

* * * * *

UNITED STATES PATENT AND TRADEMARK OFFICE
CERTIFICATE OF CORRECTION

PATENT NO. : 4,709,302

DATED : November 24, 1987

INVENTOR(S) : William D. Jordan, et al.

It is certified that error appears in the above-identified patent and that said Letters Patent is hereby corrected as shown below:

```
In Column 7, line 25,   change "preventing" to ---presenting---
In Column 7, line 26,   before "apparatus" insert ---alignment---
In Column 7, line 27,   change "boarded" to ---board ---
In Column 8, line 26,   change "form" to ---from---
```

Signed and Sealed this

Seventeenth Day of May, 1988

Attest:

DONALD J. QUIGG

Attesting Officer

Commissioner of Patents and Trademarks